(12) United States Patent
Pillai et al.

(10) Patent No.: US 6,583,498 B1
(45) Date of Patent: Jun. 24, 2003

(54) INTEGRATED CIRCUIT PACKAGING WITH TAPERED STRIPLINES OF CONSTANT IMPEDANCE

(75) Inventors: Edward R. Pillai, Wappingers Falls, NY (US); Warren D. Dyckman, Peekskill, NY (US); Deana Cosmadelis, Dover Plains, NY (US)

(73) Assignee: International Business Machine Corporation, Armonk, NY (US)

( * ) Notice: Subject to any disclaimer, the term of this patent is extended or adjusted under 35 U.S.C. 154(b) by 0 days.

(21) Appl. No.: 10/217,233

(22) Filed: Aug. 9, 2002

(51) Int. Cl.[7] .................. H01L 29/40; H01L 39/00; H01L 23/02; H03H 7/38
(52) U.S. Cl. .................. 257/664; 257/663; 257/662; 257/686; 333/34; 333/33; 333/32
(58) Field of Search ............... 257/661, 662, 663, 686, 664; 333/112, 116, 117, 118, 124, 125, 128, 32, 33, 34, 204, 205, 208, 209

(56) References Cited

U.S. PATENT DOCUMENTS

| 3,605,045 | A | * | 9/1971 | Ramsbotham, Jr. ......... 333/204 |
|---|---|---|---|---|
| 3,634,789 | A | | 1/1972 | Stuckert |
| 3,990,024 | A | | 11/1976 | Hou |
| 4,371,853 | A | | 2/1983 | Makimoto et al. |
| 4,543,544 | A | | 9/1985 | Ziegner |
| 5,406,235 | A | | 4/1995 | Hayashi |
| 5,418,690 | A | | 5/1995 | Conn et al. |
| 5,767,753 | A | | 6/1998 | Ruelke |
| 5,818,315 | A | * | 10/1998 | Moongilan ............... 333/238 |
| 5,977,850 | A | | 11/1999 | Chaturvedi |
| 6,170,154 | B1 | | 1/2001 | Swarup |
| 6,304,156 | B1 | | 10/2001 | Ishizaki et al. |
| 6,310,525 | B1 | | 10/2001 | Nakakubo et al. |
| 6,441,471 | B1 | * | 8/2002 | Maetani ................... 257/664 |
| 6,452,254 | B2 | * | 9/2002 | Bosch et al. ............. 257/664 |

FOREIGN PATENT DOCUMENTS

| JP | 10138555 | | 5/1998 |
|---|---|---|---|
| JP | 11330808 | * | 11/1999 |

OTHER PUBLICATIONS

IBM Technical Disclosure Bulletin—vol. 33, No. 4, Sep. 1990 Transmission Line with windowed ground plane pp 152–153.
IBM Technical Disclosure Bulletin—vol. 27, No. 11, Apr. 1985 Silicon integrated superconducting stripline pp 6645–6647.

* cited by examiner

Primary Examiner—Nathan J. Flynn
Assistant Examiner—Victor A. Mandala, Jr.
(74) Attorney, Agent, or Firm—Eric Petraske

(57) ABSTRACT

In a package for integrated circuits, a signal transmission line has a first segment closer to the chip that is bracketed vertically by ground planes at a first vertical distance and a second segment further from the chip that is bracketed vertically by ground planes at a second vertical distance greater than the first distance, with an aperture being formed in the ground planes at the first distance, so that those ground planes do not interfere with the impedance set by the second set of ground planes.

12 Claims, 3 Drawing Sheets

INTEGRATED CIRCUIT PACKAGING WITH TAPERED STRIPLINES OF CONSTANT IMPEDANCE

TECHNICAL FIELD

The field of the invention is that of packaging integrated circuits, in particular circuits processing signals in the gigabit range.

BACKGROUND OF THE INVENTION

In the field of packaging integrated circuits, it is well known that unmatched impedances will result in reflections at the interface and possible signal degradation. Those skilled in the art are well aware of formulas used to calculate geometrical structures that provide a desired impedance.

The problem addressed by the present invention is that of reducing transmission losses in an ultrawideband (0–30 GHz) frequency range while maintaining constant impedance throughout the length of the line. Many prior art approaches are narrowband and do not satisfy the frequency requirement.

As frequency increases, losses that depend on the conductor width increase. Simply increasing the width would change the impedance of the line.

One prior art approach specific to a microstrip transmission line on the surface of the package (Japanese Patent Abstract 11330808) changes the vertical distance to a ground plane only below the microstrip. Transmission lines on the surface are constrained by space considerations. It remains, however, a problem for the art to provide a structure adapted for signal transmission through the interior of a package with the desired impedance and reasonable cost.

SUMMARY OF THE INVENTION

The invention relates to an integrated circuit packaging structure that provides a signal-carrying member passing through the body of the package and having two sections with different appropriate dimensions for low-loss transmission, together with ground planes spaced appropriately to maintain the desired impedance.

A feature of the invention is the increase in vertical spacing both above and below the signal member when the signal member is widened to decrease signal power loss.

Another feature of the invention is the creation of an aperture in the closest ground plane to the signal member, so that the next ground plane in vertical position can act to maintain the desired impedance.

DETAILED DESCRIPTION OF THE INVENTION

Figure 1:
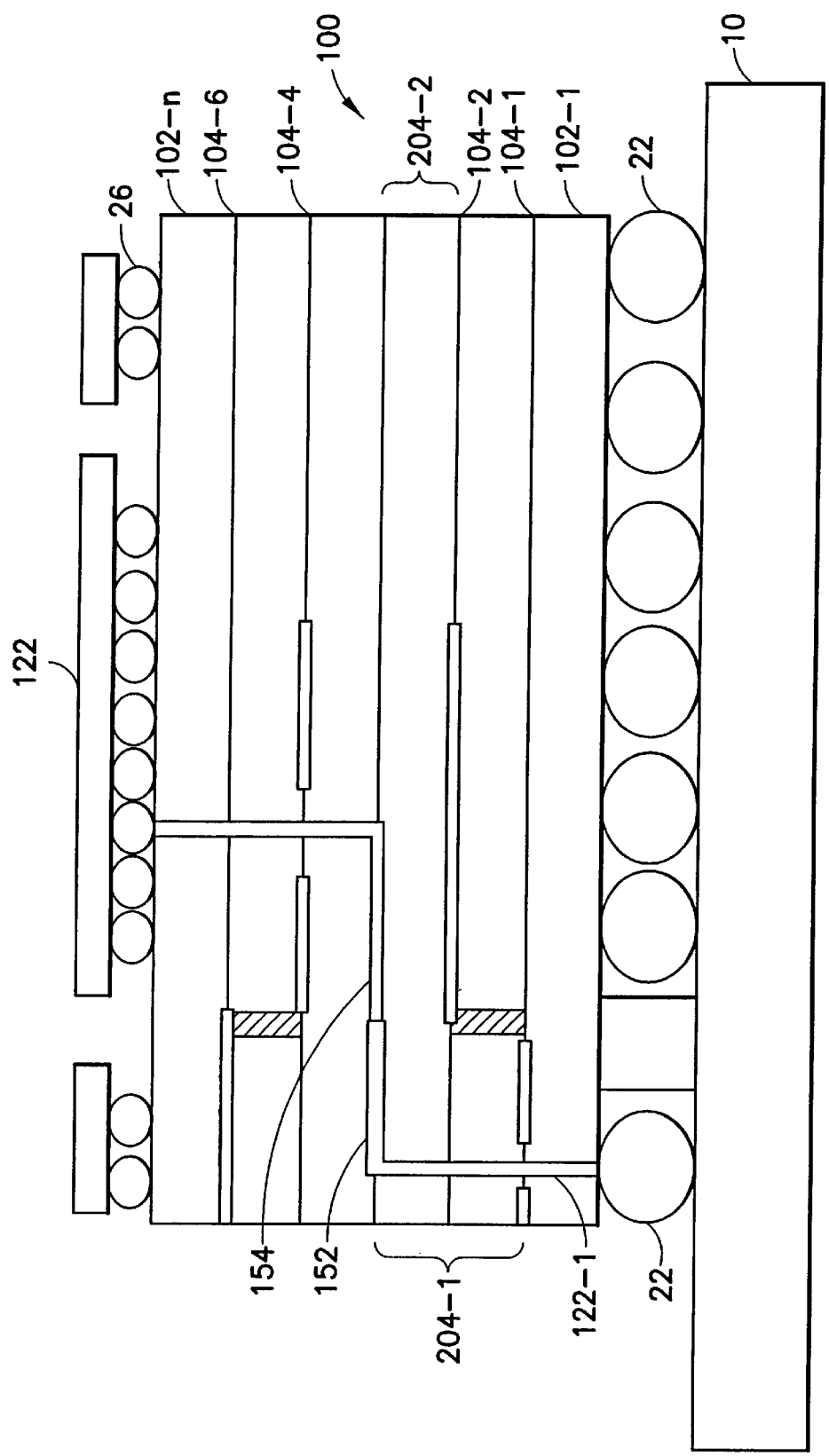
FIG. 1 shows in cross section a portion of a ceramic chip carrier according the invention.

In FIG. 1, a simplified view of a ceramic chip carrier 100 shows a printed circuit board 10 holding the chip carrier, which has ball grid contacts 22 at the bottom and integrated circuit 122 at the top, connected by ball grids 26. Carrier 100 is formed from a set of dielectric layers 102-1–102-n, separated by thin layers that contain the conductive sheets that carry signals. A nominal dielectric layer thickness is denoted with bracket 204-2 on the right of FIG. 1 and a double thickness is denoted with bracket 204-1 on the left. A signal-carrying member 150 according to the invention connects the leftmost ball grid 22, rising through via 122-1 and then traveling to the right through two areas having different vertical spacing, and finishing with a ball grid 26 on the top of carrier 100 (making contact with chip 122).

At the center of the Figure, underneath chip 122, the signal member is relatively narrow (perpendicular to the plane of the paper) and the ground planes 104-2 and 104-4, which are the ones in the adjacent plane (separated vertically by distance 204-2), are used to maintain the design impedance of the transmission line. For purposes of the following claims, ground planes 104-2 and 104-4 will be said to bracket the signal member vertically. Those skilled in the art will be aware that the electrical designer works with the layer thickness 204-2, which is selected as a result of engineering tradeoffs (bonding more sheets cost more and thin sheets are more fragile) and selects the width perpendicular to the paper to present the correct impedance (nominally 50 ohms) with a spacing between signal-carrying element 154 and the closest ground planes in levels 104-2 and 104-4.

Such a compact arrangement causes a greater transmission loss to the signals than would be the case for a wider piece of conductor that would have less skin effects and lower resistance for a given resistivity of the material. Nominally, the thickness of a signal line is about 70 microns in the plane of the paper and 30 microns perpendicular to it. The nominal thickness of a ceramic layer 102-i is 100 microns.

On the left of the Figure, first signal member 152 is wider in the direction perpendicular to the plane of the paper and has ground planes 104-6 on the top and 104-1 on the bottom, displaced from strip 152 by distance 204-1, greater than distance 204-2. Ground planes 104-2 and 104-4 have apertures where the use of planes 104-6 and 104-1 is required to maintain the design impedance, so that planes 104-1 and 104-2 do not interfere. The signal path in question starts and ends with a vertical member (via) that does not in the frequency range of approximately 0–20 GHz affect the operation of the invention. The ground planes are separated from the signal member by a distance denoted with bracket 204-1. At the transition between the outer ground planes 104-1 and 104-6 and the inner ground planes 104-2 and 104-4, there are vias connecting the ground planes. These vias are convenient and provide a continuous ground reference, but are not absolutely required and the ground planes could be connected to one another elsewhere, provided care is taken to avoid inadvertently introducing resonance effects. At the transition region, the taper angle is nominally 45 degrees. Other angles are also acceptable, as long as the total length of the taper remains below a fraction of the wavelength at the desired frequency.

At the center of the Figure, the signal piece is narrower and the ground planes are closer, separated from the signal member by a distance denoted with bracket 204-2. Those skilled in the art will be aware that the dimensions of lower ball grid array 22 and upper array 26 impose a requirement on the geometry of the signal path—the transverse dimensions at the start of the path can be much larger than the transverse dimensions at the chip interface in order to fit the required number of chip contacts in a confined space. In order to reduce signal loss, a designer will make the signal carrying member wider at the outer portion of the carrier and reduce the width as required in order to avoid interference with adjacent lines as the chip is approached.

Figure 2:
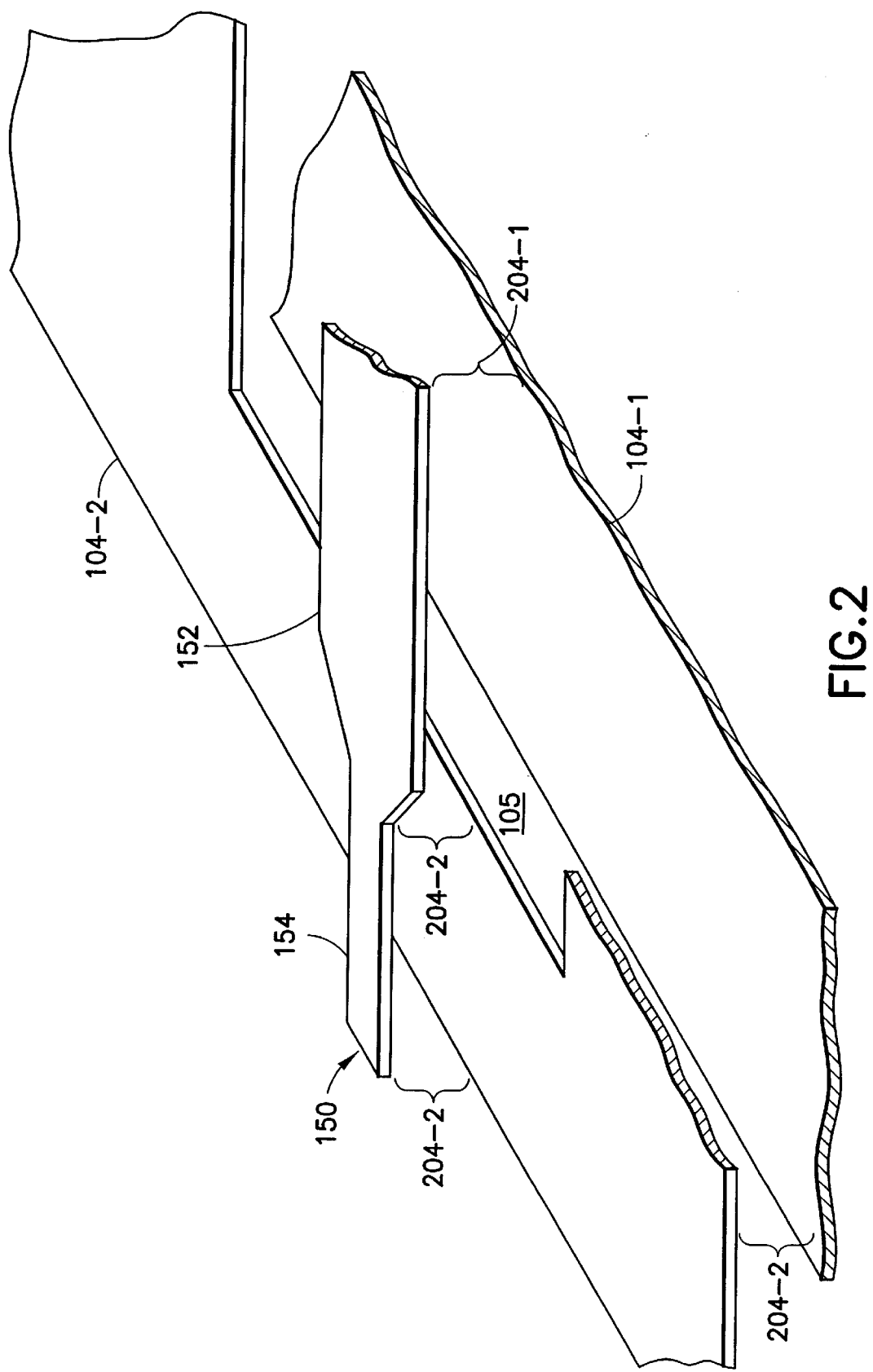
FIG. 2 shows in perspective a portion of a signal line according to the invention.

FIG. 2 shows a detail in perspective of the transition between narrower and wider portions of the signal line. A narrower portion 154 of strip 150 is separated from the nearest ground plane 104-2 by a distance denoted with bracket 204-2. At the wider portion, the nearest ground plane is plane 104-1, chosen in order to maintain the design impedance. An aperture 105 has been formed in ground plane 104-2, so that strip 152 can "see" (i.e. not be influenced adversely by other ground planes) the correct ground plane. The right side of layer 104-2 is cut away so that the lower layer 104-1 may be seen. Both planes 104-1 and 104-2 extend out of the Figure and are cut off for clarity in presentation. Also, the vertical conductive "walls" extending transversely to line 150 in FIG. 1 and the symmetric ground planes above strip 152 have been suppressed in this view. Those skilled in the art will be aware of the dimensions of aperture 105 required so that any influence on the signal will be within acceptable limits: i.e. it will be made oversize in order to avoid adversely affecting signal transmission.

In general, the thickness of the layers 102-i will be chosen as a result of various engineering tradeoffs, so that the available choices for the interlayer distance 204-1 will not, in general, be optimum. This is one of many design tradeoffs and choices that designers must make. The terms "impedance matching" and the like are to be understood as being, not an exact match, but within ordinary design tolerances.

Figure 3:
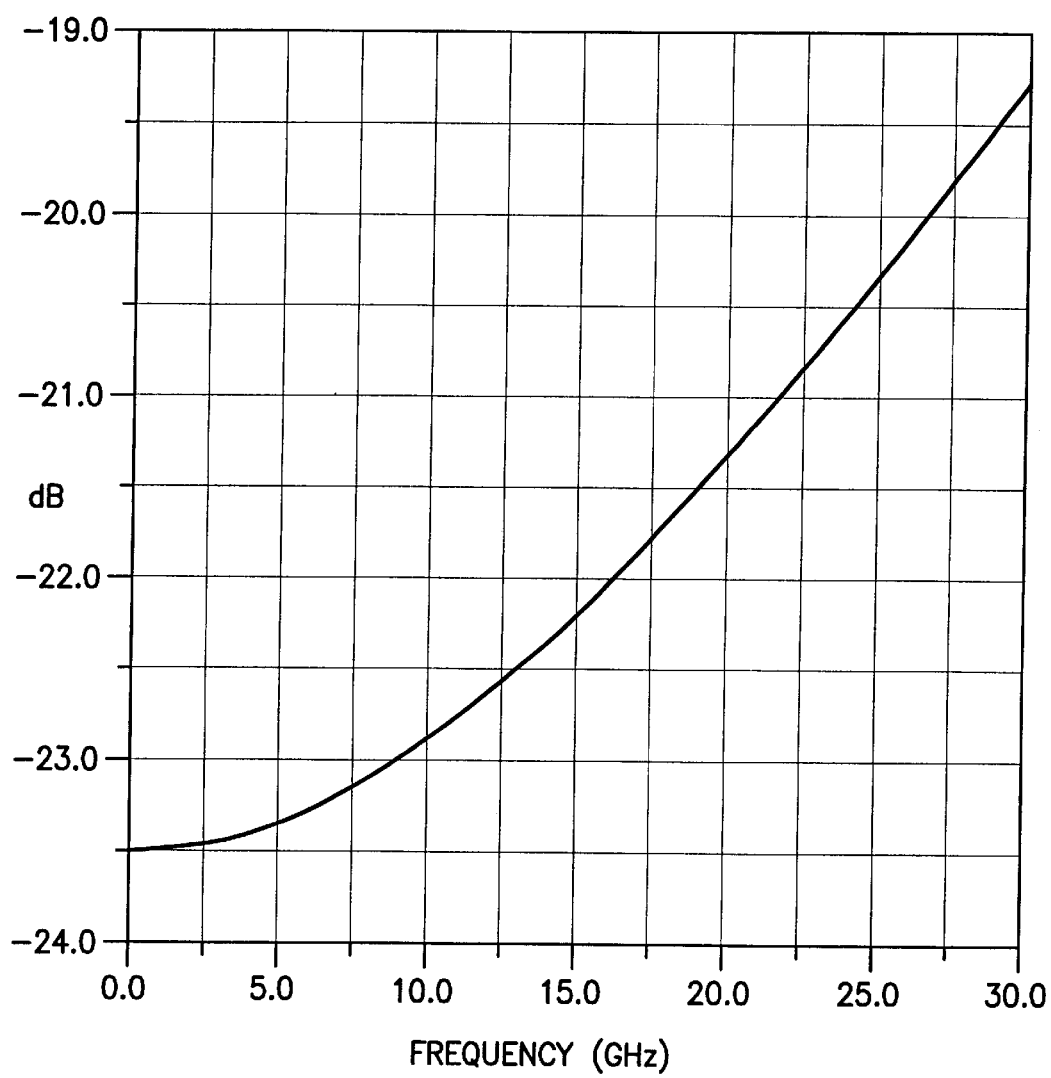
FIG. 3 shows return loss as a function of frequency

Those skilled in the art are aware of the requirements for impedance matching and the consequences of impedance mismatch. Referring now to FIG. 3, the return loss for a line according to the invention is shown for the range 0–30 GHz. The frequency response shows that reflections are minimized and better than −15 dB is easily achieved out to 30 GHz. Thus, the signal power loss has been reduced by tapering to a wider line while maintaining frequency response within an acceptable range.

The invention has been illustrated with an example in which the second vertical distance is two thicknesses of dielectric, but other distances (e.g. three thicknesses) could be used and more than two vertical distances could be used on one line.

The contacts on the top and bottom surfaces could be other than ball grids, e.g. wire bond pads or flat metal pads, which are included within the term contact array.

While the invention has been described in terms of a single preferred embodiment, those skilled in the art will recognize that the invention can be practiced in various versions within the spirit and scope of the following claims.

We claim:

1. A multilayer package for holding at least one integrated circuit chip, having a top surface, a bottom surface;
   a top contact array attached to said top surface and a set of layers of dielectric disposed between said top surface and bottom surface;
   a bottom contact array attached to said bottom surface;
   at least one conductive signal line within said multilayer package connecting a bottom contact to a top contact, said conductive signal line comprising a first horizontal segment of a first width and a second horizontal segment of a second width greater than said first width, in which said first horizontal segment is bracketed vertically by a first set of top and bottom ground planes separated vertically from said first horizontal segment by a first vertical distance and said second horizontal segment is bracketed vertically by a second set of top and bottom ground planes separated vertically from said second horizontal segment by a second vertical distance greater than said first vertical distance, said first and second vertical distances being set to maintain a design impedance.

2. A multilayer package according to claim 1, in which said first set of top and bottom ground planes have apertures positioned above and below said second horizontal segment, whereby the impedance of said signal line is determined by said second vertical distance in said second horizontal segment.

3. A multilayer package according to claim 2, in which said top ground planes of said first and second set o f ground planes are connected by a conductive via at a transition between said first vertical distance and said second vertical distance and said bottom ground planes of said first and second set of ground planes are connected by a conductive via at a transition between said first vertical distance and said second vertical distance, whereby said ground planes maintain continuity at said transition.

4. A multilayer package according to claim 2, in which said apertures in said first set of top and bottom ground planes have horizontal dimensions such that the effect of said first set of top and bottom ground planes in said second horizontal segment is below a threshold amount.

5. A multilayer package according to claim 3, in which said apertures in said first set of top and bottom ground planes have horizontal dimensions such that the effect of said first set of top and bottom ground planes in said second horizontal segment is below a threshold amount.

6. A multilayer package according to claim 1, in which said first horizontal segment is located closer to said chip than said second horizontal segment.

7. A multilayer package according to claim 2, in which said top ground planes of said first and second set of ground planes are connected by a conductive via at a location displaced from the transition between said first vertical distance and said second vertical distance and said bottom ground planes of said first and second set of ground planes are connected by a conductive via at a transition between said first vertical distance and said second vertical distance, whereby said ground planes maintain continuity at said transition.

8. A multilayer package according to claim 6, in which said apertures in said first set of top and bottom ground planes have horizontal dimensions such that the effect of said first set of top and bottom ground planes in said second horizontal segment is below a threshold amount.

9. A multilayer package according to claim 6, in which said first horizontal segment is located closer to said chip than said second horizontal segment.

10. A multilayer package according to claim 6, in which said first vertical distance is the thickness of one layer of dielectric and said second vertical distance is the thickness of two layers of dielectric.

11. A multilayer package according to claim 6, in which said first vertical distance is the thickness of one layer of dielectric and said second vertical distance is the thickness of more than two layers of dielectric.

12. A multilayer package according to claim 1, further comprising a third horizontal segment bracketed vertically by a third set of top and bottom ground planes separated vertically from a third second horizontal segment by a third vertical distance greater than said second vertical distance, said first, second and third vertical distances being set to maintain a design impedance.

* * * * *